United States Patent
Lim et al.

(10) Patent No.: US 7,085,984 B2
(45) Date of Patent: Aug. 1, 2006

(54) SYSTEM AND METHOD FOR PROVIDING AN IMPROVED CHANNEL ENCODER IN A DIGITAL DATA COMMUNICATIONS SYSTEM

(75) Inventors: Jae Doeg Lim, Allen, TX (US); Adnan Kavak, Izmit (TR)

(73) Assignee: Samsung Electronics Co., Ltd., Suwon (KR)

(*) Notice: Subject to any disclaimer, the term of this patent is extended or adjusted under 35 U.S.C. 154(b) by 267 days.

(21) Appl. No.: 10/035,801

(22) Filed: Dec. 28, 2001

(65) Prior Publication Data

US 2003/0135807 A1   Jul. 17, 2003

(51) Int. Cl.
*H03M 13/00* (2006.01)
*H03M 13/03* (2006.01)

(52) U.S. Cl. .................. 714/755; 714/790
(58) Field of Classification Search ............ 714/755, 714/786, 790
See application file for complete search history.

(56) References Cited

U.S. PATENT DOCUMENTS

| | | | |
|---|---|---|---|
| 5,907,582 A * | 5/1999 | Yi | 375/259 |
| 6,061,387 A * | 5/2000 | Yi | 375/142 |
| 6,374,386 B1 * | 4/2002 | Kim et al. | 714/786 |
| 6,397,367 B1 * | 5/2002 | Park et al. | 714/786 |
| 6,553,516 B1 * | 4/2003 | Suda et al. | 714/702 |

* cited by examiner

*Primary Examiner*—Albert Decady
*Assistant Examiner*—Esaw Abraham

(57) ABSTRACT

A system and method is disclosed for providing an improved channel encoder in a digital data communication system. In one advantageous embodiment the invention comprises a channel encoder that comprises a first Turbo encoder, an interleaver, and a second Turbo encoder. Data from a source encoder is Turbo encoded in the first Turbo encoder, then interleaved, and then Turbo encoded in the second Turbo encoder. The data is then punctured and repeated in a symbol puncture and repetition unit. In an alternate advantageous embodiment of the invention, the first and second Turbo encoders are coupled in parallel. The data provided to one of the Turbo encoders is interleaved. The outputs of the first and second Turbo encoders are multiplexed and the result is provided to the symbol puncture and repetition unit. The invention provides low packet error rates when higher RF modulation is used.

25 Claims, 7 Drawing Sheets

SYSTEM AND METHOD FOR PROVIDING AN IMPROVED CHANNEL ENCODER IN A DIGITAL DATA COMMUNICATIONS SYSTEM

TECHNICAL FIELD OF THE INVENTION

The present invention is directed, in general, to digital data communications systems and devices and, more specifically, to a system and method for providing an improved channel encoder for a digital data communications system.

BACKGROUND OF THE INVENTION

Wireless communication systems, including cellular phones, paging devices, personal communication services (PCS) systems, and wireless data networks, have become ubiquitous in society. Wireless service providers continually try to create new markets for wireless devices and to expand existing markets by making wireless devices and services cheaper and more reliable. The price of end-user wireless devices, such as cell phones, pagers, PCS systems, and wireless modems, has been driven down to the point where these devices are affordable to nearly everyone and the price of a wireless device is only a small part of the end-user's total cost. To continue to attract new customers, wireless service providers concentrate on reducing infrastructure costs and operating costs, and on increasing handset battery lifetime, while improving quality of service in order to make wireless services cheaper and better.

To maximize usage of the available bandwidth, a number of multiple access technologies have been implemented to allow more than one subscriber to communicate simultaneously with each base station (BS) in a wireless system. These multiple access technologies include time division multiple access (TDMA), frequency division multiple access (FDMA), and code division multiple access (CDMA). These technologies assign each system subscriber to a specific traffic channel that transmits and receives subscriber voice/data signals via a selected time slot, a selected frequency, a selected unique code, or a combination thereof.

CDMA technology is used in wireless computer networks, paging (or wireless messaging) systems, and cellular telephony. In a CDMA system, mobile stations and other access terminals (e.g., pagers, cell phones, laptop PCs with wireless modems) and base stations transmit and receive data on the same frequency in assigned channels that correspond to specific unique orthogonal codes. For example, a mobile station may receive forward channel data signals from a base station that are encoded, formatted, interleaved, spread with a Walsh code and a long pseudo-noise (PN) sequence. In another example, a base station may receive reverse channel data signals from the mobile station that are encoded, block interleaved, modulated, and spread with a spreading code derived from the mobile station identification number prior to transmission by the mobile station. The data symbols following interleaving may be separated into an in-phase (I) data stream and a quadrature (Q) data stream for QPSK modulation of an RF carrier. One such implementation is found in the TIA/EIA-95 CDMA standard (also known as IS-95). Another implementation is the TIA/EIA-2000 standard (also known as IS-2000).

The current generation of cellular phones is used primarily for voice conversations between a subscriber device (or wireless device) and another party through the wireless network. A smaller number of wireless devices are data devices, such as personal digital assistants (PDAs) equipped with cellular/wireless modems. Because the bandwidth for a current generation wireless device is typically limited to a few tens of kilobits per second (kbps), the applications for the current generation of wireless devices are relatively limited. However, this is expected to change in the next (or third) generation of cellular/wireless technology, sometimes referred to as "3G" cellular/wireless, where much greater bandwidth will be available to each wireless device (i.e., one hundred fifty three and six tenths kilobits per second (153.6 kbps) or greater). The higher data rates will make Internet applications for wireless devices much more common. For instance, a 3G cellular telephone (or a PC with a 3G cellular modem) may be used to browse web sites on the Internet, to transmit and receive graphics, to execute streaming audio or video applications, and the like. A much higher percentage of the wireless traffic handled by 3G cellular systems will be Internet protocol (IP) traffic and a lesser percentage will be traditional voice traffic.

Real-time streaming of multimedia content over Internet protocol (IP) networks has become an increasingly common application in recent years. As noted above, 3G wireless networks will provide streaming data (both video and audio) to wireless devices for real time applications. A wide range of interactive and non-interactive multimedia Internet applications, such as news on-demand, live TV viewing, video conferencing, live radio broadcasting (such as Broadcast.com), and the like, will provide "real time" data streaming to wireless devices. Unlike a "downloaded" video file, which may be retrieved first in "non-real" time and viewed or played back later, real time (or streaming) data applications require a data source to encode and to transmit a streaming data signal over a network to a receiver, which must decode and play the signal (video or audio) in real time.

In an IS-2000 system, or in a 1xEV-DO system, or in several of the currently proposed 1xEV-DV systems, packet data is Turbo encoded in blocks using a Turbo encoder. Turbo encoders are well known in the art. See, e.g., C. C. Gumas, "Turbo Codes Rev Up Error-Correcting Performance," Personal Engineering & Instrumentation News, pp. 61–66, January 1998.

The Turbo encoded packet data is then modulated using either a QPSK RF modulator, or an 8-PSK RF modulator, or a 16-QAM RF modulator. A 64-QAM RF modulator requires a higher signal to noise ratio (SNR) than the signal to noise ratio (SNR) required for a 16-QAM RF modulator. The 64-QAM RF modulator requires, for instance, about nineteen decibels (19 dB) SNR and the 16-QAM RF modulator requires about fifteen decibels (15 dB) SNR.

It is known that 1xEV-DO systems require a 16-QAM RF modulator to support high packet data rates at 2.45 Mbps. To support high packet data rates at 2.45 Mbps in 1xEV-DO systems a mobile station requires a received signal to noise ratio (SNR) of nine and five tenths decibels (9.5 dB) using 16-QAM modulation in order to achieve a one percent (1%) packet data error rate. To support high packet data rates at 2.45 Mbps in 1xEV-DO systems a mobile station requires a received signal to noise ratio (SNR) of eighteen and five tenths decibels (18.5 dB) using 64-QAM modulation in order to achieve a one percent (1%) packet data error rate.

A signal to noise ratio (SNR) of eighteen and five tenths decibels (18.5 dB) is not achievable for IS-2000 based systems. Assuming that a 1xMC IS-2000 system could provide an 18.5 dB SNR, the 18.5 dB SNR would still not enable the system to achieve a one percent (1%) packet data error rate using 64-QAM modulation. This is because an ordinary Turbo encoding process can not achieve packet data error rates less than one percent (1%) when higher RF modulation is used (i.e., 64-QAM modulation or greater).

Therefore there is a need in the art for an improved channel encoder that is capable of providing a low packet data error rate when higher RF modulation is used. In particular, there is a need for an improved channel encoder that is capable of providing a packet data error rate less than one percent (1%) when a 64-QAM RF modulation is used.

SUMMARY OF THE INVENTION

It is an object of the present invention to provide a system and method that is capable of providing an improved channel encoder in a digital data communications system.

In one advantageous embodiment the improved channel encoder of the present invention comprises a first Turbo encoder, an interleaver, and a second Turbo encoder. Data from a source encoder in the digital data communications system is Turbo encoded in the first Turbo encoder. The data is then interleaved in the interleaver. The data is then Turbo encoded in the second Turbo encoder. The data is then punctured and repeated in a symbol puncture and repetition unit.

In an alternate advantageous embodiment the improved channel encoder of the present invention comprises a first Turbo encoder and a second Turbo encoder are coupled in parallel. Data from a source encoder in the digital data communications system is provided to the first Turbo encoder and to an interleaver coupled in parallel with the first Turbo encoder. The interleaved data from the interleaver is then input to the second Turbo encoder. The outputs of the first Turbo encoder and the output of the second Turbo encoder are multiplexed in a multiplexer. The multiplexed data is then punctured and repeated in a symbol puncture and repetition unit.

It is an object of the present invention to provide a channel encoder comprising a first Turbo encoder and a second Turbo encoder.

It is also an object of the present invention to provide a first Turbo encoder coupled in series with an interleaver, and a second Turbo encoder coupled in series with the interleaver.

It is also an object of the present invention to provide a channel encoder comprising a first Turbo encoder and a second Turbo encoder coupled in parallel, and an interleaver coupled in series with one of the Turbo encoders.

It is yet another object of the present invention to provide a channel encoder comprising a symbol puncture and repetition unit capable of puncturing and repeating Turbo encoded data.

It is an additional object of the present invention to provide a channel encoder comprising a first Turbo encoder and a second Turbo encoder wherein said channel encoder is capable of providing a low packet data error rate when higher RF modulation is used.

It is also an object of the present invention to provide a channel encoder comprising a first Turbo encoder and a second Turbo encoder wherein said channel encoder is capable of providing a packet data error rate less than one percent (1%) when a 64-QAM RF modulation is used.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged digital data communications system.

Figure 1:
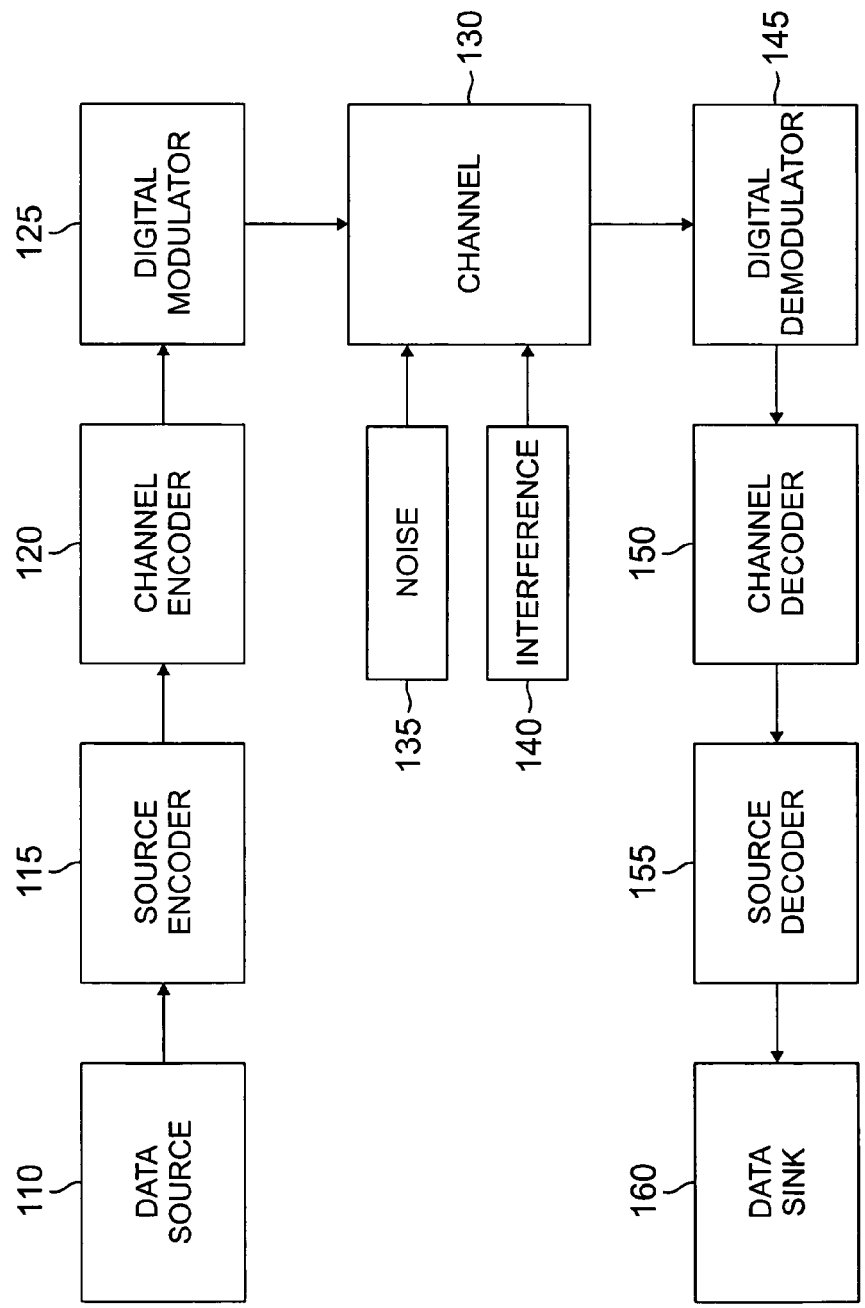
FIG. 1 illustrates an exemplary prior art digital data communications system.

FIG. 1 illustrates an exemplary prior art digital data communications system 100. As is well known in the art, data source 110, source encoder 115, channel encoder 120, and digital modulator 125 comprise a transmitter of digital data communications system 100. Digital demodulator 145, channel decoder 150, source decoder 155, and data sink 160 comprise a receiver of digital data communications system 100. Data from digital modulator 125 of the transmitter is sent through channel 130 to digital demodulator 145 of the receiver. While being sent though channel 130 the data signals from digital modulator 125 experience noise 135 and interference 140 before they reach digital demodulator 145.

Figure 2:
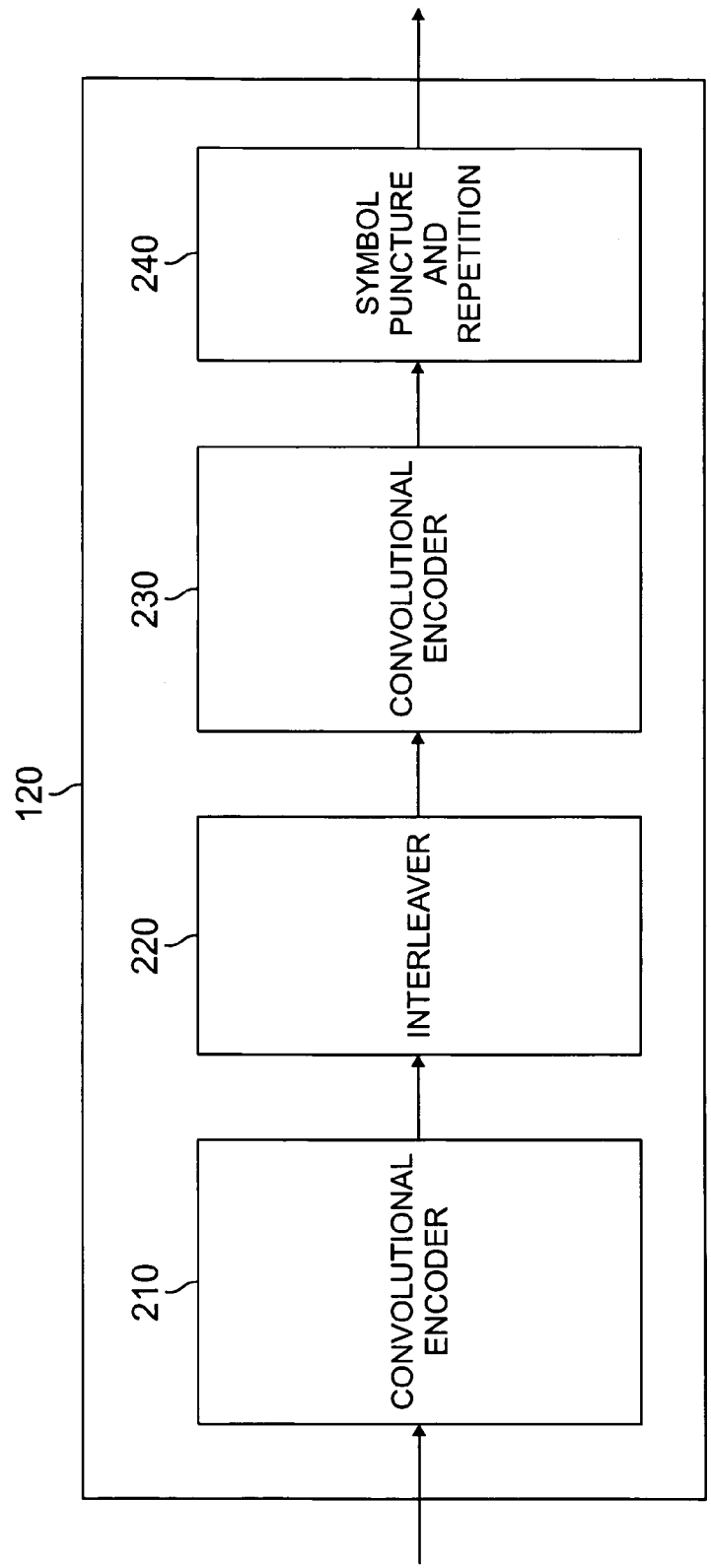
FIG. 2 illustrates an exemplary prior art Turbo encoder.

FIG. 2 illustrates an exemplary embodiment of a prior art Turbo encoder 120 employed as a channel encoder 120 in digital data communications system 100. Turbo encoder 120 comprises convolutional encoder 210, interleaver 220, convolutional encoder 230, and symbol puncture and repetition unit 240. Data from source encoder 115 is sent to convolutional encoder 210 where the data is convolutionally encoded in accordance with well known principles. The data is then interleaved in interleaver 220, also in accordance with well known principles. The interleaved data is then convolutionally encoded in convolutional encoder 230. Then the data from convolutional encoder 230 is provided to symbol puncture and repetition unit 240 where the data is punctured and repeated, also in accordance with well known principles. The data from symbol puncture and repetition unit 240 is then provided to digital modulator 125. Turbo encoder 120 is not limited to the particular embodiment described above. Alternative forms of Turbo encoder 120 may be constructed using one or more different designs.

Figure 3:
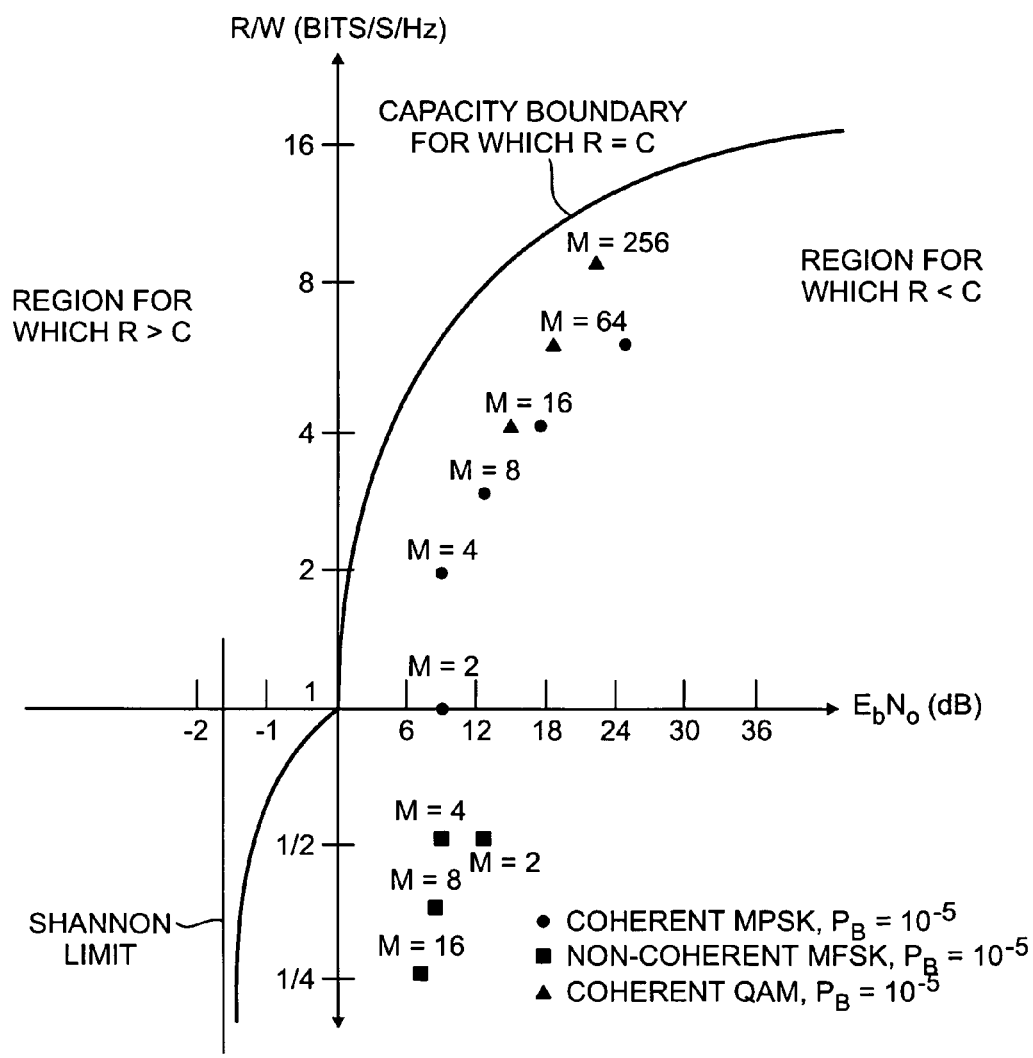
FIG. 3 illustrates a prior art bandwidth efficiency graph.

FIG. 3 illustrates an exemplary prior art bandwidth efficiency graph 300. Engineers who design digital data communications systems choose coding and modulation techniques based on power and bandwidth limitations. Graph 300 shown in FIG. 3 plots spectral efficiency (measured as the ratio of information rate R to bandwidth W) in bits/sec/Hz versus signal to noise ratio (SNR) (measured as the ratio of $E_b$ to $N_o$) in decibels. That is, the vertical axis represents the spectral efficiency (the ratio of information rate to bandwidth) and the horizontal axis represents the signal to noise ratio (SNR). The spectral efficiency is a measure of how much data can be communicated in a specified bandwidth with a given time.

The "capacity boundary" (where the information rate R equals the system capacity C) represents an ideal channel. The "capacity boundary" divides the upper left portion of graph 300 (where R>C and reliable communications are not possible) from the lower right portion of graph 300 (where R<C and reliable communications are possible). Every communication signal falls somewhere within the lower right portion of graph 300.

In an IS-2000 system, or in a 1xEV-DO system, or in several currently proposed 1xEV-DV systems, packet data is Turbo encoded in blocks using a Turbo encoder. The Turbo encoded packet data is then modulated using either a QPSK RF modulator, or an 8-PSK RF modulator, or a 16-QAM RF modulator. The bandwidth efficiency for these modulators may be obtained by referring to graph 300 in FIG. 3. It may be seen that a 64-QAM RF modulator requires a higher signal to noise ratio (SNR) than the signal to noise ratio (SNR) required for a 16-QAM RF modulator. The 64-QAM RF modulator requires about nineteen decibels (19 dB) SNR and the 16-QAM RF modulator requires about fifteen decibels (15 dB) SNR.

It is known that 1xEV-DO systems require a 16-QAM RF modulator to support high packet data rates at 2.45 Mbps. To support high packet data rates at 2.45 Mbps in 1xEV-DO systems a mobile station requires a received signal to noise ratio (SNR) of nine and five tenths decibels (9.5 dB) using 16-QAM modulation in order to achieve a one percent (1%) packet data error rate. To support high packet data rates at 2.45 Mbps in 1xEV-DO systems a mobile station requires a received signal to noise ratio (SNR) of eighteen and five tenths decibels (18.5 dB) using 64-QAM modulation in order to achieve a one percent (1%) packet data error rate.

A signal to noise ratio (SNR) of eighteen and five tenths decibels (18.5 dB) is not achievable for IS-2000 based systems. Assuming that a 1xMC IS-2000 system could provide an 18.5 dB SNR, the 18.5 dB SNR would still not enable the system to achieve a one percent (1%) packet data error rate using 64-QAM modulation. This is because an ordinary Turbo encoding process can not achieve packet data error rates less than one percent (1%) when higher RF modulation is used (i.e., 64-QAM modulation or greater).

The present invention provides an apparatus and method for providing an improved channel encoder that is capable of providing a low packet data error rate when higher RF modulation is used. In particular, the apparatus and method of the present invention is capable of providing a packet data error rate less than one percent (1%) when a 64-QAM RF modulation is used.

Figure 4:
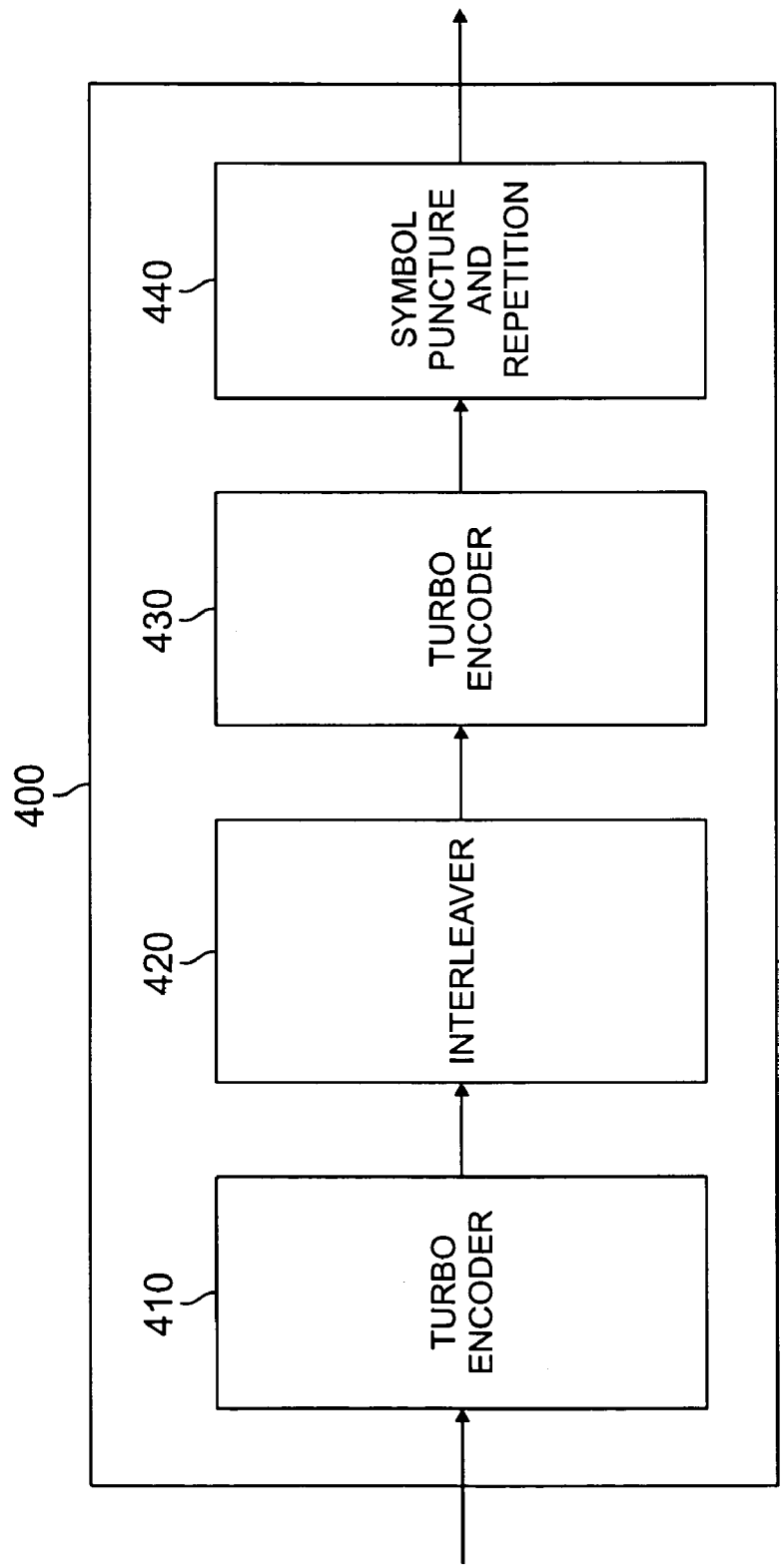
FIG. 4 illustrates an advantageous embodiment of a channel encoder in accordance with the principles of the present invention.

FIG. 4 illustrates an advantageous embodiment of channel encoder 400 in accordance with the principles of the present invention. Channel encoder 400 comprises Turbo encoder 410, interleaver 420, Turbo encoder 430 and symbol puncture and repetition unit 440. Channel encoder 400 of the present invention occupies the position of channel encoder 120 shown in FIG. 1.

Figure 5:
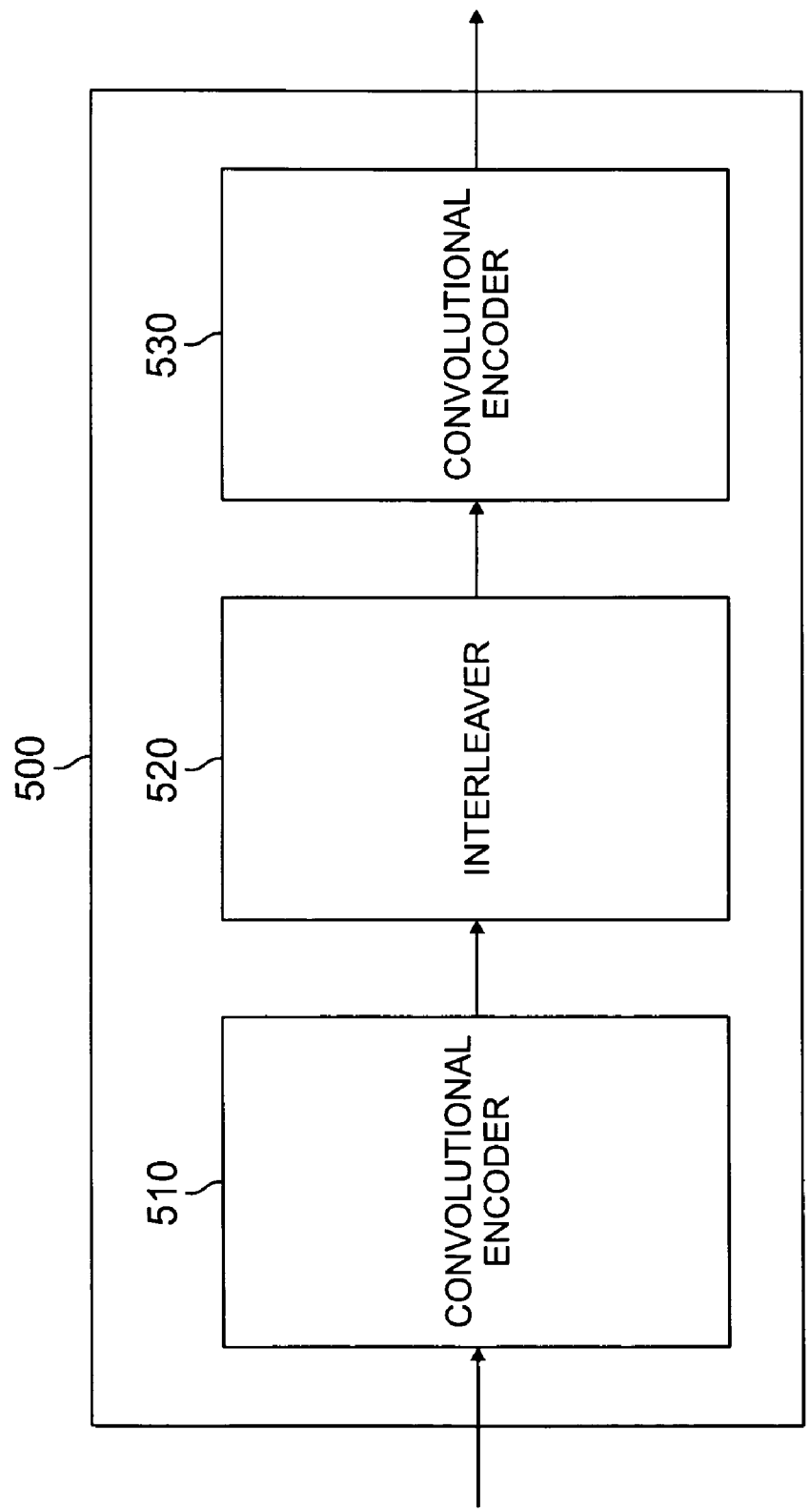
FIG. 5 illustrates an advantageous embodiment of a Turbo encoder for use with the present invention.

In one advantageous embodiment of the present invention, Turbo encoder 410 comprises Turbo encoder 500 shown in FIG. 5. Specifically, Turbo encoder 410 comprises convolutional encoder 510, interleaver 520, and convolutional encoder 530. Data entering convolutional encoder 510 is convolutionally encoded in accordance with well known principles. Convolutional encoder 510 has a structure of the type specified in the IS-95-B standard or in the IS-2000 standard. The data from convolutional encoder 510 is then interleaved in interleaver 520. The interleaved data is then convolutionally encoded in convolutional encoder 530. Convolutional encoder 530 also has a structure of a type specified in the IS-95-B standard or in the IS-2000 standard.

Turbo encoder 500 (and, therefore, Turbo encoder 410) does not comprise a symbol puncture and repetition unit. The symbol puncture and repetition function may be performed in channel encoder 400 in symbol puncture and repetition unit 440. Because the symbol puncture and repetition function is optional, this function may not be performed in some embodiments of the invention.

In one advantageous embodiment of the present invention, Turbo encoder 430 also comprises Turbo encoder 500. In this advantageous embodiment, Turbo encoder 430 has the same structure as Turbo encoder 410. It is noted, however, that other types of Turbo encoders may be used for Turbo encoder 410 and Turbo encoder 430.

Data from source encoder 115 is sent to Turbo encoder 410 of channel encoder 400. Turbo encoder 410 then encodes the data in accordance with well known Turbo coding principles. The data is then interleaved in interleaver 420. The interleaved data is then Turbo encoded in Turbo encoder 430. Then the data from Turbo encoder 430 is provided to symbol puncture and repetition unit 440. As previously mentioned, the use of the symbol puncture and repetition unit 440 is optional. If the symbol puncture and repetition unit 440 is used, then the data from symbol puncture and repetition unit 440 is provided to digital modulator 125. If the symbol puncture and repetition unit 440 is not used, then the data from Turbo encoder 430 is provided to directly to digital modulator 125.

Let N be the number of bits that are provided to Turbo encoder 410 of channel encoder 400 after the number of physical layer packet TAIL field has been discarded. The N bits are Turbo encoded in Turbo encoder 410, then interleaved in interleaver 420, and Turbo encoded in Turbo encoder 430. The encoded output symbols from Turbo encoder 430 are punctured and repeated in the symbol puncture and repetition unit 440 to achieve the desired number of Turbo encoder output symbols. The desired number of output symbols is equal to (N+TAIL) divided by R where R represents the encoder rate and where TAIL represents the number of TAIL bits.

Channel encoder 400 of the present invention provides lower packet error rates when higher RF modulation is used. Channel encoder 400 of the present invention is capable of providing a packet data error rate less than one percent (1%) when 64-QAM RF modulation is used.

Figure 6:
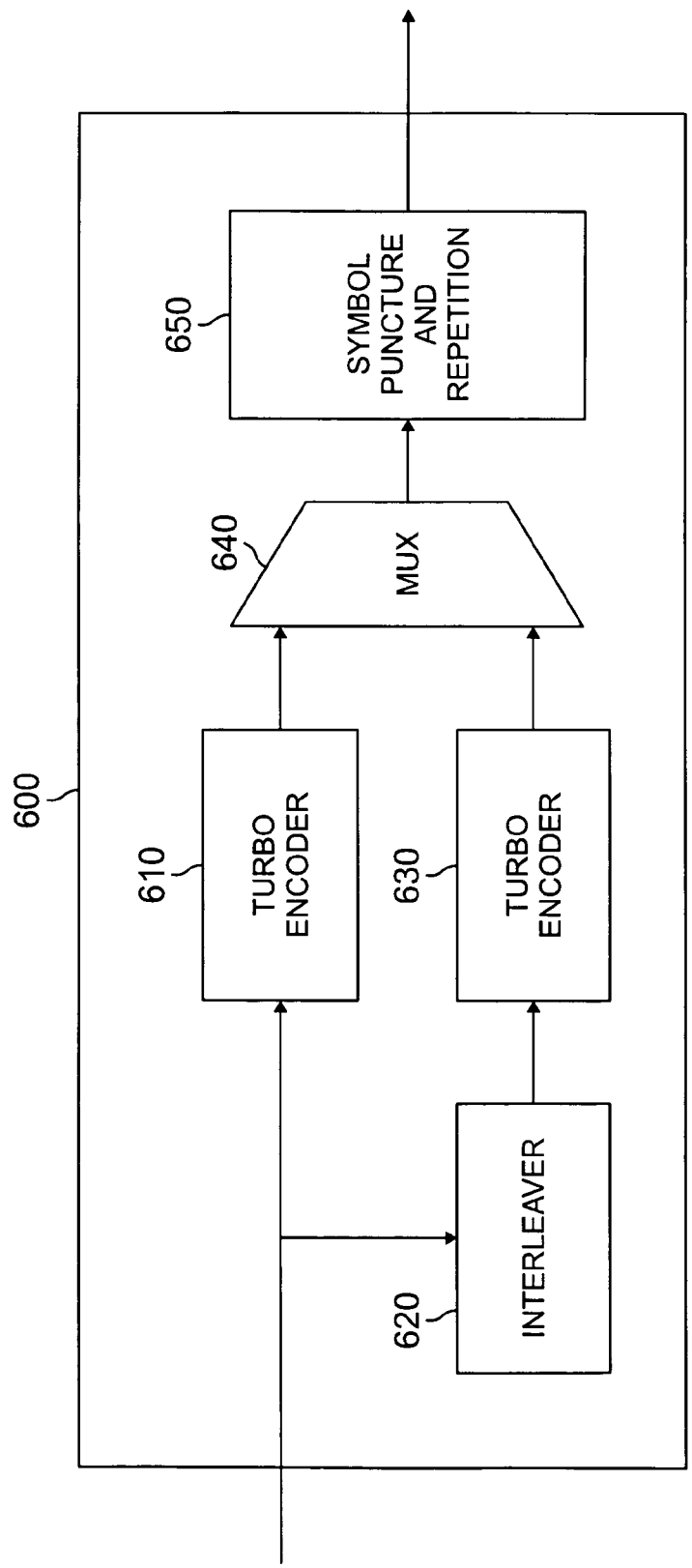
FIG. 6 illustrates an alternate advantageous embodiment of a channel encoder in accordance with the principles of the present invention.

The present invention is not limited to the particular advantageous embodiment described above with reference to channel encoder 400. Alternate forms of the channel encoder of the present invention may be constructed using one or more different designs. One alternate advantageous embodiment of the channel encoder of the present invention is shown in FIG. 6 as channel encoder 600.

Channel encoder 600 comprises Turbo encoder 610, interleaver 620, Turbo encoder 630, multiplexer 640, and symbol puncture and repetition unit 650. Channel encoder 600 of the present invention occupies the position of channel encoder 120 shown in FIG. 1.

Data from source encoder 115 is sent to Turbo encoder 610 of channel encoder 600. Turbo encoder 610 then encodes the data in accordance with well known Turbo coding principles. A copy of the data from source encoder 115 is sent to interleaver 620. This copy of the data is interleaved in interleaver 620. The interleaved data from interleaver 620 is then Turbo encoded in Turbo encoder 630. The Turbo encoded data from Turbo encoder 610 and the Turbo encoded data from Turbo encoder 630 is provided multiplexer 640 where the two data streams are multiplexed. The multiplexed data stream from multiplexer 640 is then sent to the symbol puncture and repetition unit 650.

The use of the symbol puncture and repetition unit 650 is optional. If the symbol puncture and repetition unit 650 is used, then the data from symbol puncture and repetition unit 650 is provided to digital modulator 125. If the symbol puncture and repetition unit 650 is not used, then the data from multiplexer 640 is provided to directly to digital modulator 125.

Figure 7:
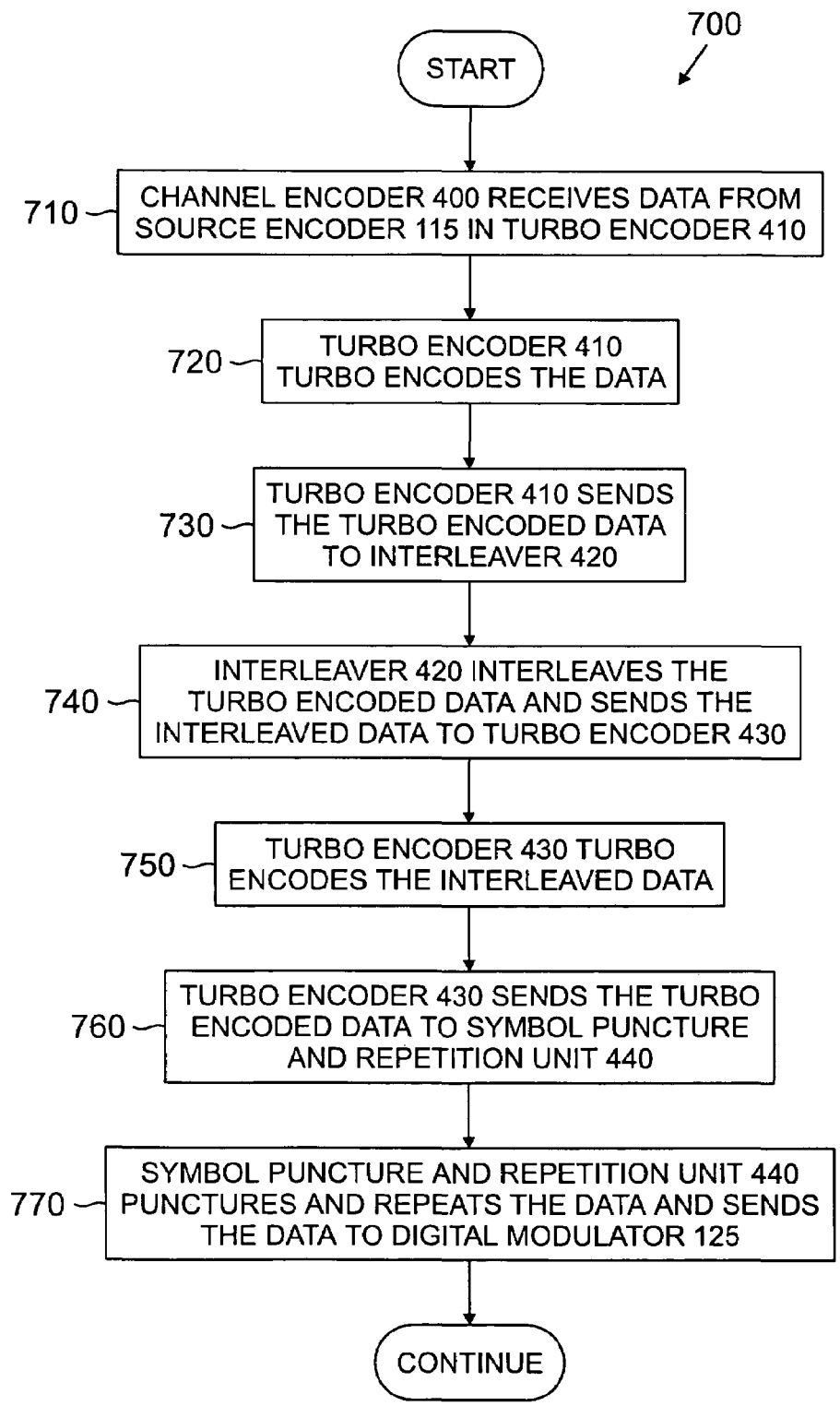
FIG. 7 illustrates a flow chart showing the steps of an advantageous embodiment of a method of the present invention for providing an improved channel encoder in a digital data communications system.

FIG. 7 illustrates a flow chart 700 showing the steps of an advantageous embodiment of a method of the present invention for providing an improved channel encoder in a digital data communications system. Channel encoder 400 receives data from source encoder 115 in Turbo encoder 410 (step 710). Turbo encoder 410 Turbo encodes the data (step 720). Then Turbo encoder 410 sends the Turbo encoded data to interleaver 420 (step 730). Interleaver 420 interleaves the Turbo encoded data and sends the interleaved data to Turbo encoder 430 (step 740). Then Turbo encoder 430 Turbo encodes the interleaved data (step 750). Turbo encoder 430 then sends the Turbo encoded data to symbol puncture and repetition unit 440 (step 760). Symbol puncture and repetition unit 440 punctures and repeats the data and sends the data to digital modulator 125 (step 770).

Although the present invention has been described in detail, those skilled in the art should understand that they can make various changes, substitutions and alterations herein without departing from the spirit and scope of the invention in its broadest form.

What is claimed is:

1. For use in a digital data communications system, an apparatus for use as a channel encoder comprising:
   a first Turbo encoder configured for turbo encoding data, having an output;
   an interleaver unit having an input coupled to said output of said first Turbo encoder, said interleaver unit configured for interleaving Turbo encoded data from said first Turbo encoder, and said interleaver unit having an output; and
   a second Turbo encoder having an input coupled to said output of said interleaver unit, said second Turbo encoder configured for turbo encoding interleaved data from said interleaver unit.

2. The apparatus as set forth in claim 1 further comprising a symbol puncture and repetition unit coupled to said second Turbo encoder, said symbol puncture and repetition unit capable of puncturing and repeating Turbo encoded data from said second Turbo encoder.

3. The apparatus as set forth in claim 2 wherein said apparatus is capable of providing a packet data error rate less than one percent (1%) when 64-QAM RF modulation is used.

4. The apparatus as set forth in claim 1 wherein said first Turbo encoder comprises:
   a first convolutional encoder capable of convolutionally encoding data;
   an interleaver unit coupled to said first convolutional encoder, said interleaver unit configured for interleaving convolutionally encoded data from said first convolutional encoder; and
   a second convolutional encoder coupled to said interleaver unit, said second convolutional encoder configured for convolutionally encoding interleaved data from said interleaver unit.

5. The apparatus as set forth in claim 1 wherein said second Turbo encoder comprises:
   a first convolutional encoder capable of convolutionally encoding data;
   an interleaver unit coupled to said first convolutional encoder, said interleaver unit configured for interleaving convolutionally encoded data from said first convolutional encoder; and
   a second convolutional encoder coupled to said interleaver unit, said second convolutional encoder configured for convolutionally encoding interleaved data from said interleaver unit.

6. For use in a digital data communications system, an apparatus for use as a channel encoder comprising:
   a first Turbo encoder configured for turbo encoding data, wherein said first Turbo encoder is capable of receiving data from a source encoder of said digital data communications system;
   an interleaver unit coupled in parallel with said first Turbo encoder, wherein said interleaver unit is configured for receiving data from said source encoder of said digital data communications system, and wherein said interleaver unit is configured for interleaving said data from said source encoder;

a second Turbo encoder configured for turbo encoding data, wherein an input of said second Turbo encoder is coupled to an output of said interleaver unit, and wherein said second Turbo encoder is configured for turbo encoding interleaved data from said interleaver unit; and a multiplexer having a first input coupled to an output of said first Turbo encoder and having a second input coupled to an output of said second Turbo encoder, said multiplexer configured for multiplexing data from said first Turbo encoder and from said second Turbo encoder.

7. The apparatus as set forth in claim 6 further comprising a symbol puncture and repetition unit having an input coupled to an output of said multiplexer, said symbol puncture and repetition unit configured for puncturing and repeating multiplexed data from said multiplexer.

8. The apparatus as set forth in claim 6 wherein said first Turbo encoder comprises:
   a first convolutional encoder configured for convolutionally encoding data;
   an interleaver unit coupled to said first convolutional encoder, said interleaver unit configured for interleaving convolutionally encoded data from said first convolutional encoder; and
   a second convolutional encoder coupled to said interleaver unit, said second convolutional encoder configured for convolutionally encoding interleaved data from said interleaver unit.

9. The apparatus as set forth in claim 6 wherein said second Turbo encoder comprises:
   a first convolutional encoder capable of convolutionally encoding data;
   an interleaver unit coupled to said first convolutional encoder, said interleaver unit configured for interleaving convolutionally encoded data from said first convolutional encoder; and
   a second convolutional encoder coupled to said interleaver unit, said second convolutional encoder configured for convolutionally encoding interleaved data from said interleaver unit.

10. A digital data communications system comprising a channel encoder comprising:
    a first Turbo encoder having an output, said first Turbo encoder configured for turbo encoding data from a source encoder of said digital data communications system;
    an interleaver unit having an input coupled to said output of said first Turbo encoder, said interleaver unit configured for interleaving Turbo encoded data from said first Turbo encoder, and said interleaver unit having an output; and
    a second Turbo encoder having an input coupled to said output of said interleaver unit, said second Turbo encoder configured for turbo encoding interleaved data from said interleaver unit.

11. The digital data communications system as set forth in claim 10 wherein said channel encoder further comprises a symbol puncture and repetition unit coupled to said second Turbo encoder, said symbol puncture and repetition unit capable of puncturing and repeating Turbo encoded data from said second Turbo encoder.

12. The digital data communications system as set forth in claim 10 wherein said first Turbo encoder comprises:
    a first convolutional encoding configured for convolutionally encoding data;
    an interleaver unit coupled to said first convolutional encoder, said interleaver unit configured for interleaving convolutionally encoded data from said first convolutional encoder; and
    a second convolutional encoder coupled to said interleaver unit, said second convolutional encoder configured for convolutionally encoding interleaved data from said interleaver unit.

13. The digital data communications system as set forth in claim 10 wherein said second Turbo encoder comprises:
    a first convolutional encoder configured for convolutionally encoding data;
    an interleaver unit coupled to said first convolutional encoder, said interleaver unit configured for interleaving convolutionally encoded data from said first convolutional encoder; and
    a second convolutional encoder coupled to said interleaver unit, said second convolutional encoder configured for convolutionally encoding interleaved data from said interleaver unit.

14. A digital data communications system comprising a channel encoder comprising:
    a first Turbo encoder capable of Turbo encoding data, wherein said first Turbo encoder is configured for receiving data from a source encoder of said digital data communications system;
    an interleaver unit coupled in parallel with said first Turbo encoder, wherein said interleaver unit is configured for receiving data from said source encoder of said digital data communications system, and wherein said interleaver unit is configured for interleaving said data from said source encoder;
    a second Turbo encoder configured for turbo encoding data, wherein an input of said second Turbo encoder is coupled to an output of said interleaver unit, and wherein said second Turbo encoder is configured for turbo encoding interleaved data from said interleaver unit; and
    a multiplexer having a first input coupled to an output of said first Turbo encoder and having a second input coupled to an output of said second Turbo encoder, said multiplexer configured for multiplexing data from said first Turbo encoder and from said second Turbo encoder.

15. The digital data communications system as set forth in claim 14 wherein said channel encoder further comprises a symbol puncture and repetition unit having an input coupled to an output of said multiplexer, said symbol puncture and repetition unit configured for puncturing and repeating multiplexed data from said multiplexer.

16. The digital data communications system as set forth in claim 14 wherein said first Turbo encoder comprises:
    a first convolutional encoder configured for convolutionally encoding data;
    an interleaver unit coupled to said first convolutional encoder, said interleaver unit configured for interleaving convolutionally encoded data from said first convolutional encoder; and
    a second convolutional encoder coupled to said interleaver unit, said second convolutional encoder configured for convolutionally encoding interleaved data from said interleaver unit.

17. The digital data communications system as set forth in claim 14 wherein said second Turbo encoder comprises:
    a first convolutional encoder configured for convolutionally encoding data;

an interleaver unit coupled to said first convolutional encoder, said interleaver unit configured for interleaving convolutionally encoded data from said first convolutional encoder; and a second convolutional encoder coupled to said interleaver unit, said second convolutional encoder configured for convolutionally encoding interleaved data from said interleaver unit.

18. For use in a digital data communications system comprising a channel encoder, a method of operating said channel encoder comprising the steps of:

encoding data with a first Turbo encoder;

interleaving Turbo encoded data from said first Turbo encoder with a first interleaver unit; and encoding interleaved data from said first interleaver unit with a second Turbo encoder.

19. The method as set forth in claim 18 further comprising the step of:

puncturing and repeating Turbo encoded data from said second Turbo encoder in a symbol puncture and repetition unit coupled to said second Turbo encoder.

20. The method as set forth in claim 18 wherein said step of encoding data with a first Turbo encoder comprises the steps of:

convolutionally encoding data in a first convolutional encoder;

interleaving convolutionally encoded data from said first convolutional encoder in a second interleaver unit coupled to said first convolutional encoder; and convolutionally encoding interleaved data from said second interleaver unit in a second convolutional encoder coupled to said second interleaver unit.

21. The method as set forth in claim 18 wherein said step of encoding interleaved data from said first interleaver unit with a second Turbo encoder comprises the steps of:

convolutionally encoding interleaved data from said first interleaver unit in a first convolutional encoder;

interleaving convolutionally encoded data from said first convolutional encoder in a second interleaver unit coupled to said first convolutional encoder; and convolutionally encoding interleaved data from said second interleaver unit in a second convolutional encoder coupled to said second interleaver unit.

22. For use in a digital data communications system comprising a channel encoder, a method of operating said channel encoder, said method comprising the steps of:

encoding data from a source encoder of said digital data communications system with a first Turbo encoder;

interleaving data from a source encoder of said digital data communications system with a first interleaver unit coupled in parallel with said first Turbo encoder;

encoding interleaved data from said first interleaver unit with a second Turbo encoder coupled to said first interleaver unit; and multiplexing interleaved data from said first interleaver unit and Turbo encoded data from said first Turbo encoder in a multiplexer coupled to said first interleaver unit and to said first Turbo encoder.

23. The method as set forth in claim 22 further comprising the step of:

puncturing and repeating multiplexed data from said multiplexer in a symbol puncture and repetition unit coupled to said multiplexer.

24. The method as set forth in claim 22 wherein said step of encoding data from a source encoder of said digital data communications system with a first Turbo encoder comprises the steps of:

convolutionally encoding said data from said source encoder in a first convolutional encoder;

interleaving convolutionally encoded data from said first convolutional encoder in a second interleaver unit coupled to said first convolutional encoder; and convolutionally encoding interleaved data from said second interleaver unit in a second convolutional encoder coupled to said second interleaver unit.

25. The method as set forth in claim 22 wherein said step of encoding interleaved data from said first interleaver unit with a second Turbo encoder comprises the steps of:

convolutionally encoding interleaved data from said first interleaver unit in a first convolutional encoder;

interleaving convolutionally encoded data from said first convolutional encoder in a second interleaver unit coupled to said first convolutional encoder; and convolutionally encoding interleaved data from said second interleaver unit in a second convolutional encoder coupled to said second interleaver unit.

* * * * *